(12) United States Patent
Sohn

(10) Patent No.: US 7,795,905 B2
(45) Date of Patent: Sep. 14, 2010

(54) ON DIE TERMINATION (ODT) CIRCUIT HAVING IMPROVED HIGH FREQUENCY PERFORMANCE

(75) Inventor: Young-Soo Sohn, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 44 days.

(21) Appl. No.: 12/125,489

(22) Filed: May 22, 2008

(65) Prior Publication Data

US 2008/0290894 A1 Nov. 27, 2008

(30) Foreign Application Priority Data

May 22, 2007 (KR) .................. 10-2007-0049937

(51) Int. Cl.
*H03K 17/16* (2006.01)
(52) U.S. Cl. ........................................ 326/30; 327/108
(58) Field of Classification Search .................. 326/30, 326/81, 86; 327/391, 309
See application file for complete search history.

(56) References Cited

U.S. PATENT DOCUMENTS

| 4,859,877 | A | * | 8/1989 | Cooperman et al. ........... 326/30 |
| 5,329,190 | A | * | 7/1994 | Igarashi et al. .............. 327/309 |
| 5,644,255 | A | * | 7/1997 | Taylor .......................... 326/81 |
| 6,265,893 | B1 | * | 7/2001 | Bates ........................... 326/30 |
| 6,285,236 | B1 | * | 9/2001 | Stephens ..................... 327/391 |
| 6,300,799 | B1 | * | 10/2001 | Nakamura .................... 326/86 |
| 6,731,137 | B1 | * | 5/2004 | Rangan et al. ................ 326/86 |
| 7,102,200 | B2 | | 9/2006 | Fan et al. |
| 7,429,871 | B2 | * | 9/2008 | Kim et al. .................... 326/30 |
| 2003/0214319 | A1 | | 11/2003 | Whitworth |
| 2005/0122130 | A1 | * | 6/2005 | Kiehl et al. ................... 326/30 |

FOREIGN PATENT DOCUMENTS

| KR | 2004-0043995 | 5/2004 |
| KR | 2004-0055879 | 6/2004 |
| KR | 2004-0068719 | 8/2004 |

OTHER PUBLICATIONS

English language abstract of Korean Publication No. 2004-0055879.
English language abstract of Korean Publication No. 2004-0068719.

* cited by examiner

*Primary Examiner*—Vibol Tan
*Assistant Examiner*—Crystal L Hammond
(74) *Attorney, Agent, or Firm*—Muir Patent Consulting, PLLC

(57) ABSTRACT

An On Die Termination (ODT) circuit for performing an ODT operation. The ODT circuit includes a resistor having a first end to receive an ODT enable signal; and a switch unit coupled to a second end of the resistor. The ODT operation is performed in response to the ODT enable signal passing through the resistor.

22 Claims, 5 Drawing Sheets

ON DIE TERMINATION (ODT) CIRCUIT HAVING IMPROVED HIGH FREQUENCY PERFORMANCE

CROSS-REFERENCE TO RELATED PATENT APPLICATION

This application claims the benefit of Korean Patent Application No. 10-2007-0049937, filed on May 22, 2007, in the Korean Intellectual Property Office, the disclosure of which is incorporated herein in its entirety by reference.

BACKGROUND

1. Technical Field

This disclosure relates to an On Die Termination (ODT) circuit, and more particularly, to an ODT circuit which has improved high frequency performance, and can be used as a data output terminal.

2. Description of the Related Art

On Die Termination (ODT) technology has been developed to minimize signal reflection, distortion, or the like in an interface between a system and a memory to improve signal integrity (SI). Signal reflection has a negative influence on signal integrity. In particular, in a memory system supporting a high-speed operation, signal reflection has a more negative influence on signal integrity. In order to suppress such signal reflection, lines for transmitting signals between a system and a memory can be terminated by a termination resistor.

In general, in a memory system, the input/output (I/O) terminals of a memory controller or a memory can be implemented with an ODT circuit. The ODT circuit can be terminated by a termination resistor, where the resistance of the termination resistor is set to match the impedance of transmission lines.

In the case where an ODT circuit is used in a semiconductor memory device, the following items should be satisfied. First, the value of additional capacitance should be small. If the values of a junction capacitance or a parasitic capacitance are large, when a high frequency signal is input to the ODT circuit, the termination function of the ODT circuit deteriorates and signal attenuation becomes significant.

Second, the linearity of impedance should be maintained. That is, it is desirable to have a constant impedance value is maintained over a wide frequency range. If the impedance value changes sharply, signal attenuation can occur when an input signal having higher frequency components is received.

Third, the ODT circuit should be capable of being quickly turned on or off. For example, in the case of a dynamic random access memory (DRAM), or other memory device to/from which data is received/transmitted through a single data pin, an ODT circuit has to be quickly turned on or off according to whether the memory device is performing a read or a write operation.

FIG. 1A is a circuit diagram of a conventional ODT circuit 100. The conventional ODT circuit 100 includes a P-channel metal-oxide-semiconductor (PMOS) transistor P100 and a resistor R. The PMOS transistor P100 has a gate to which a ground voltage VSS is applied, a drain to which a supply voltage VDDIO is applied, and a source coupled to a first end of a resistor R. A second end of the resistor R is coupled to an input/output terminal (I/O) of a semiconductor memory device.

The ODT circuit 100 illustrated in FIG. 1 has a problem in that a parasitic capacitance component increases when the performance of the PMOS transistor P100 deteriorates. Also, if the amplitude of an input signal increases, the linearity of impedance can deteriorate since the PMOS transistor P100 transits from a triode region to a saturation region.

FIG. 1B is a circuit diagram of another conventional ODT circuit 150. The conventional ODT circuit 150 further includes an N-channel metal-oxide-semiconductor (NMOS) transistor N150, in order to solve the problem of the ODT circuit 100 illustrated in FIG. 1A. That is, in the ODT circuit 150, a first circuit, in which a PMOS transistor P150 is serially coupled to a resistor R1, is coupled in parallel to a second circuit in which an NMOS transistor N150 is serially coupled to a resistor R2.

In the case of FIG. 1B, since the ODT circuit 150 further includes the NMOS transistor N150, the ODT circuit 150 has an improved linearity of impedance, compared to the ODT circuit 100 illustrated in FIG. 1A. However, the ODT circuit 150 also still has the problem that the parasitic capacitance component increases.

FIG. 2A is a circuit diagram illustrating a case where the ODT circuit 100 (denoted by reference number 200 in FIG. 2A) illustrated in FIG. 1A is used as an output terminal. Inverted data /DATA is input to the gate of a PMOS transistor P200 of the ODT circuit 200. The ODT circuit 200 is configured to output the data /DATA through an output terminal OUT, while performing an ODT operation using a resistor R whose resistance matches the impedance of a transmission line.

FIG. 2B is a circuit diagram illustrating another case in which the ODT circuit 150 (denoted by reference number 250 in FIG. 2B) illustrated in FIG. 1B is used as an output terminal. Inverted data /DATA is input to the gates of a PMOS transistor P250 and an NMOS transistor N250. The ODT circuit 250 is configured to output the data /DATA through an output terminal OUT, while performing an ODT operation using resistors R1 and R2 whose resistances match the impedance of a transmission line.

Conventionally, in a semiconductor memory device, an ODT circuit for performing an ODT operation is used as an output terminal of the semiconductor memory device. However, when the ODT circuit is used as an output terminal, the problem as described above occurs.

SUMMARY

An embodiment includes an On Die Termination (ODT) circuit for performing an ODT operation. The ODT circuit includes a resistor having a first end to receive an ODT enable signal; and a switch unit coupled to a second end of the resistor. The ODT operation is performed in response to the ODT enable signal passing through the resistor.

Another embodiment includes an ODT circuit for performing an ODT operation, including a first driver configured to output a first control signal in response to an ODT enable signal; a second driver configured to output a second control signal in response to the ODT enable signal; a resistor having a first end coupled to an output terminal of the first driver, and a second end coupled to an output terminal of the second driver; and a switch unit coupled to the second end of the resistor and the output terminal of the second driver and responsive to the first control signal and the second control signal.

Another embodiment includes an ODT circuit for performing an ODT operation, including a pad coupled to a first node; a termination resistor coupled between the first node and a second node; a transistor coupled between the second node and a power supply, and coupled to a third node; a resistor coupled to the third node and configured to receive an ODT enable signal.

BRIEF DESCRIPTION OF THE DRAWINGS

The above and other features and advantages will become more apparent by describing embodiments in detail with reference to the attached drawings in which.

DETAILED DESCRIPTION

Figure 1A:
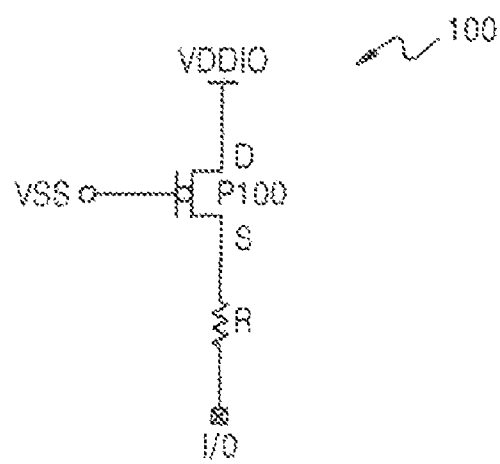
FIG. 1A is a circuit diagram of a conventional On Die Termination (ODT) circuit.
Figure 1B:
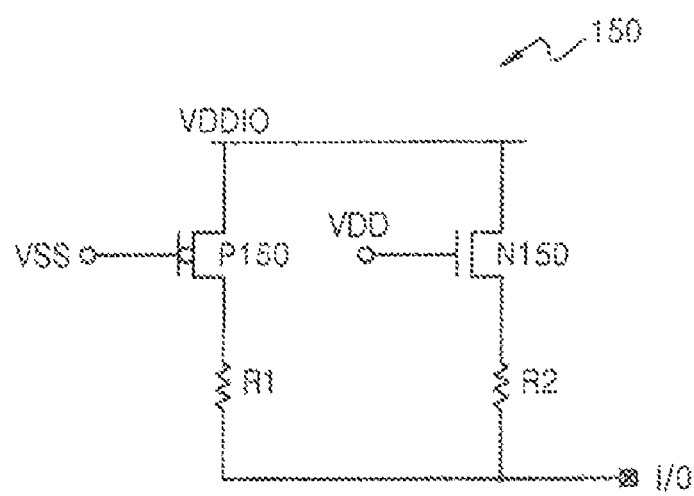
FIG. 1B is a circuit diagram of another conventional ODT circuit.
Figure 2A:
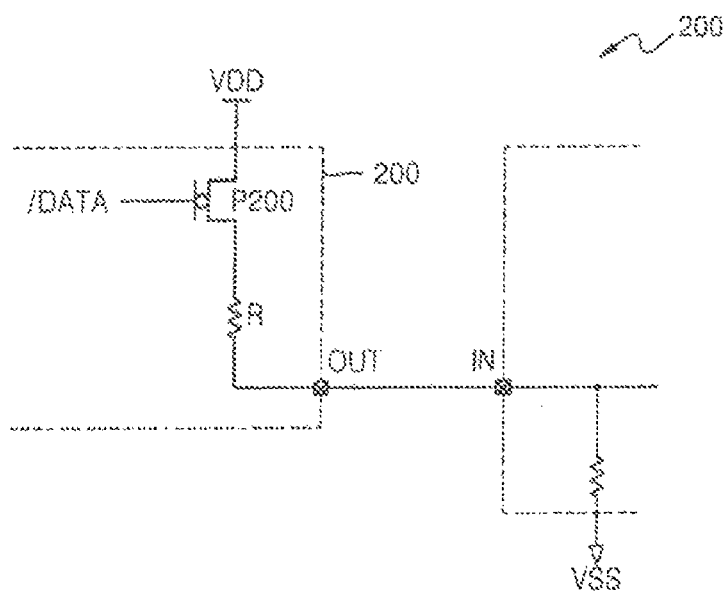
FIG. 2A is a circuit diagram illustrating a case in which the ODT circuit illustrated in FIG. 1A is used as an output terminal.
Figure 2B:
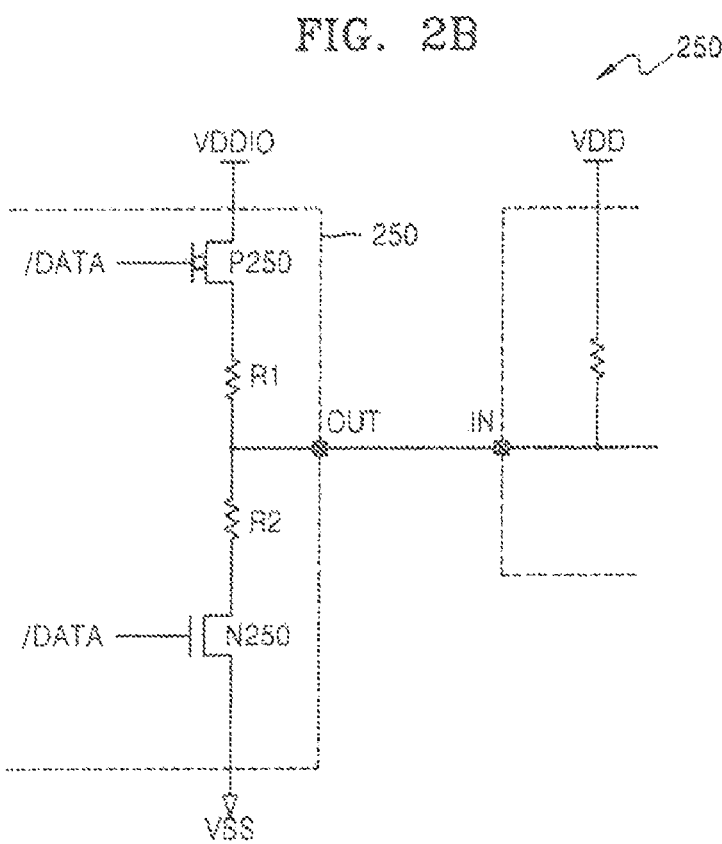
FIG. 2B is a circuit diagram illustrating another case in which the ODT circuit illustrated in FIG. 1B is used as an output terminal.

The attached drawings for illustrating embodiments are referred to in order to provide a sufficient understanding of the embodiments, the merits thereof, and the objectives accomplished by the embodiments. Hereinafter, embodiments will be described in detail with reference to the attached drawings. Like reference numerals in the drawings denote like elements.

Figure 3:
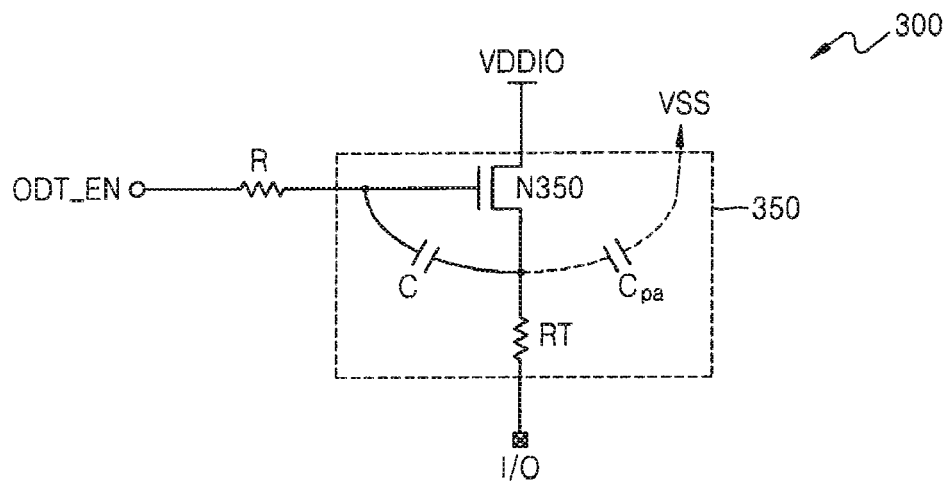
FIG. 3 is a circuit diagram of an ODT circuit according to an embodiment.

FIG. 3 is a circuit diagram of an On Die Termination (ODT) circuit 300 according to an embodiment. The ODT circuit 300 can include a resistor R and a switch unit 350. An ODT enable signal ODT_EN is applied to the resistor R. The switch unit 350 is coupled to the resistor R, and determines whether an ODT operation has to be performed, in response to the ODT enable signal ODT_EN which passes through the resistor R. The switch unit 350 can include a transistor N350 and a termination resistor RT. The gate of the transistor N350 is coupled to the resistor R, and a first terminal of the transistor N350 is coupled to a first supply voltage VDDIO. A first end of the termination resistor RT is coupled to the second terminal of the transistor N350, and a second end of the termination resistor RT is coupled to an input/output terminal I/O of the ODT circuit 300. Capacitor Cpa represents parasitic capacitance between the second terminal of the transistor N305 and the termination resistor RT.

Hereinafter, an example of an ODT operation performed by the ODT circuit 300 will be described with reference to FIG. 3. The ODT enable signal ODT_EN has a first logic state when no data is input to the input/output terminal I/O of the ODT circuit 300, and has a second logic state when data is input to the input/output terminal I/O of the ODT circuit 300. Hereinafter, the first logic state means a logic "low" state, and the second logic state means a logic "high" state; however, it is also possible that the first logic state means a logic "high" state, and the second logic state means a logic "low" state.

Continuing with the example of the operation, if data is not being input to the input/output terminal I/O of the ODT circuit 300, the ODT enable signal ODT_EN can be in the first logic state. As a result, the transistor N350 of the switch unit 350 is turned off and so the ODT circuit 300 does not perform the ODT operation. The ODT enable signal ODT_EN can change from the first logic state to the second logic state to enable the ODT operation, for example, when data will be input to the input/output terminal I/O of the ODT circuit 300. Accordingly, the transistor N350 of the switch unit 350 is turned on and the ODT circuit 300 performs the ODT operation.

In the case where a resistor R is coupled to the gate of the transistor N350, the transistor N350 can function at least in part as an inductor. An overlap capacitance component C is generated between the gate of the transistor N350 and the second terminal of the transistor N350. Due to the overlap capacitance component C, a voltage of the gate of the transistor N350 varies according to a change in the voltage of the second terminal of the transistor N350 due to capacitive coupling. For example, instantaneous changes in voltage at the second terminal of the transistor N350 also change the voltage of the gate of the transistor N350. As a result, a voltage between the gate and second terminal of the transistor N350 is maintained for instantaneous changes before being changed by current flowing through the resistor R. Accordingly, the amount of change in current that flows between the first and second terminals of the transistor N350 is reduced due to changes in voltage at the second terminal of the transistor N350. Accordingly, the transistor N350 functions as an inductor.

$$I_D = K(V_{gs} - V_{th})^2 (1 + \lambda V_{ds}) \tag{1}$$

In Equation 1, ID represents a current between the drain and source of a transistor, Vgs represents a voltage between the gate and source of the transistor, Vth represents a threshold voltage, λ represents a parameter of the transistor, and Vds represents a voltage between the drain and source of the transistor.

Referring to FIG. 3, in the current embodiment, if a voltage Vgs between the gate and second terminal of the transistor N350 becomes constant, the amount of changes in current ID which flows between the first and second terminals of the transistor N350 is reduced, so that the transistor N350 functions as an inductor.

As the overlap capacitance component C increases, coupling activity between the voltage of the gate of the transistor N350 and the voltage of the second terminal of the transistor N350 increases. As a result, the voltage between the gate and second terminal of the transistor N350 can be maintained for longer periods of time, resulting in an increased apparent amount of inductance due to the transistor N350.

An additional capacitor can be further coupled between the gate and second terminal of the transistor N350. For example, if the overlap capacitance component C is too small, the additional capacitor can increase the capacitance to a desired value. Accordingly, although the capacitance C has been described as parasitic capacitance, the capacitance C can represent both the parasitic capacitance and the capacitance from an additional capacitor.

In an embodiment, the resistor R can be selected to affect the apparent inductance of the transistor N350. For example, if a large amount of current can pass through the resistor R due to the resistor R having a relatively low value, a voltage of a node between the resistor R and the gate of the transistor N350 can be quickly increased. As a result, the voltage between the gate and second terminal of the transistor N350 will be maintained for a smaller amount of time, reducing the apparent inductance. By using a resistor R having a larger resistance value, the amount of current that will flow through the resistor R for a given voltage drop will be reduced and, consequently, the rate of change of the voltage between the gate and second terminal of the transistor N350 will be reduced. Accordingly, the apparent inductance will increase. When the transistor N350 functions as an inductor, its inductance can be defined as in Equation 2.

$$L = \frac{C_{gs}}{gm} \times \left(R - \frac{1}{gm}\right) \quad (2)$$

where Cgs represents capacitance between the gate and source of a transistor, R represents the resistance of a resistor coupled to the gate, and gm represents the transimpedance of the transistor. Referring to Equation 2, in an embodiment, the resistor R has a resistance value which is greater than an inverse number of the transimpedance of the transistor N350.

Figure 4:
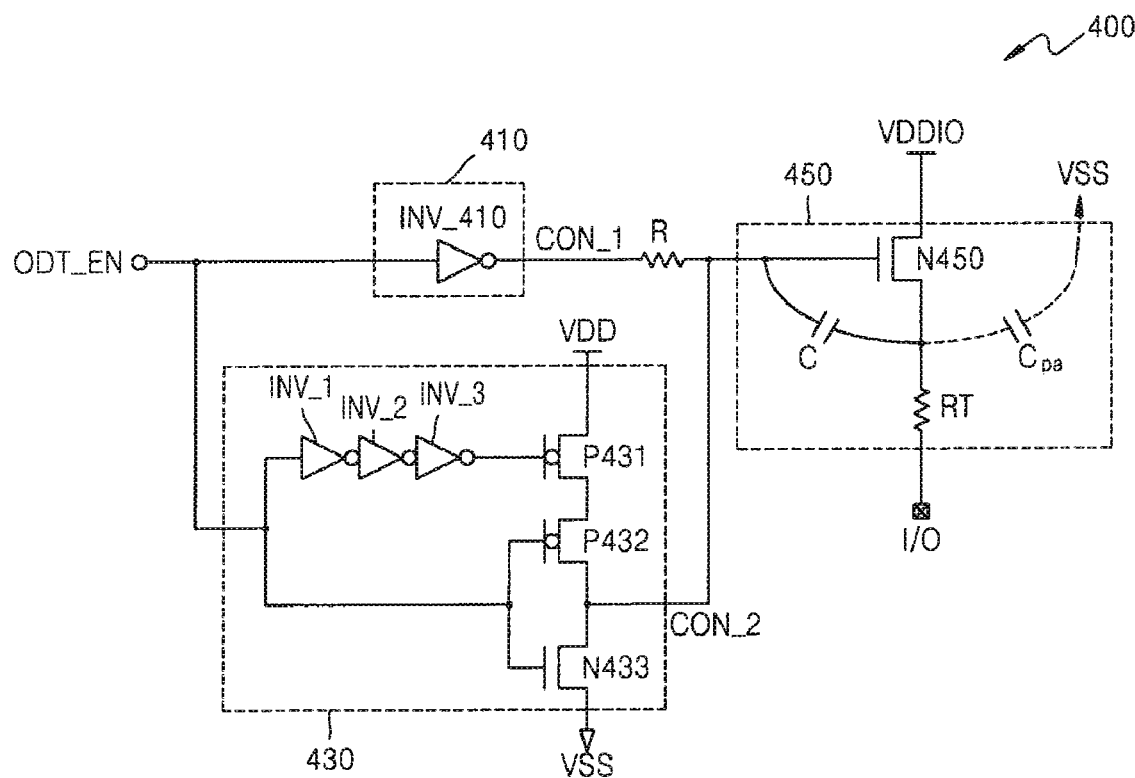
FIG. 4 is a circuit diagram of an ODT circuit according to another embodiment.

FIG. 4 is a circuit diagram of an ODT circuit 400 according to another embodiment. The ODT circuit 400 includes a first driver 410, a second driver 430, a resistor R, and a switch unit 450. The first driver 410 is configured to output a first control signal CON_1 indicating whether the ODT circuit 400 is to perform an ODT operation in response to an ODT enable signal ODT_EN. The first driver 410 may be an inverter INV_410.

The second driver 430 is configured to output a second control signal CON_2 indicating whether the ODT circuit 400 has to perform an ODT operation. In an embodiment, the second control signal CON_2 can provide a signal indicating that the ODT enable signal ODT_EN changed from a first logic state to a second logic state, from a second logic state to a first logic state, or both. The second driver 430 can include a plurality of inverters INV_1, INV_2, and INV_3, and first, second, and third transistors P431, P432, and P433. In the embodiment illustrated in FIG. 4, three inverters INV_1, INV_2, and INV_3 are used, however, the number of inverters can vary. In an embodiment, the inverters INV_1, INV_2, and INV_3 can be serially coupled to each other.

The first transistor P431 has a gate to which an output signal which passes through the inverters INV_1, INV_2, and INV_3 is applied, a first terminal to which a second supply voltage VDD is applied, and a second terminal coupled to the first terminal of the second transistor P431. The second transistor P432 has a gate to which the ODT enable signal ODT_EN is applied, a first terminal coupled to the second terminal of the first transistor P431, and a second terminal coupled to the first terminal of the third transistor N433. The third transistor N433 has a gate to which the ODT enable signal ODT_EN is applied, a first terminal coupled to the second terminal of the second transistor P432, and a second terminal to which a ground voltage VSS is applied. The first and second transistors P431 and P432 can be P-channel metal-oxide-semiconductor (PMOS) transistors, and the third transistor N433 can be an N-channel metal-oxide-semiconductor (NMOS) transistor. A first end of the resistor R is coupled to the output terminal of the first driver 410, and a second end of the resistor R is coupled to the output terminal of the second driver 430.

The switch unit 450 is coupled to the second end of the resistor R and the output terminal of the second driver 430. The switch unit 450 is configured to control whether the ODT operation is to be performed in response to the first control signal CON_1 and the second control signal CON_2. The switch unit 450 can include a transistor N450 and a termination resistor RT. The gate of the transistor N450 is coupled to the second end of the resistor R and the output terminal of the second driver 430. A first supply voltage VDDIO is applied to the first terminal of the transistor N450. A first end of the termination resistor RT is coupled to the second terminal of the transistor N450, and a second end of the termination resistor RT is coupled to an input/output terminal I/O of the ODT circuit 400.

Hereinafter, an example of an ODT operation performed by the ODT circuit 400 will be described with reference to FIG. 4. An ODT enable signal ODT_EN has a first logic state when no data is input to the input/output terminal I/O of the ODT circuit 400, and has a second logic state when data is input to the input/output terminal I/O of the ODT circuit 400. Hereinafter, the first logic state means a logic "high" state, and the second logic state means a logic "low" state; however, it is also possible that the first logic state means a logic "low" state, and the second logic state means a logic "high" state.

Continuing with the example of the operation, if data is not being input to the input/output terminal I/O of the ODT circuit 400, the first control signal CON_1, which is an output signal of the first driver 410, and the second control signal CON_2, which is an output signal of the second driver 430, can have the first logic state. Accordingly, the transistor N450 of the switch unit 450 is turned off, and the ODT circuit 400 does not perform the ODT operation.

If data will be input to the input/output terminal I/O of the ODT circuit 400, the ODT enable signal ODT_EN can be changed from the first logic state to the second logic state. In the first driver 410, if the ODT enable signal ODT_EN changes from the first logic state to the second logic state, the first control signal CON_1 changes from the second logic state to the first logic state.

In the second driver 430, if the ODT enable signal ODT_EN changes from the first logic state to the second logic state, the second transistor P432 is turned on, and the third transistor N433 is turned off. The ODT enable signal ODT_EN is inverted by the inverters INV_1, INV_2, and INV_3, and is then applied to the gate of the first transistor P431. Due to the inverters, a change in the ODT enable signal ODT_EN arrives at the gate of the first transistor P431 after a predetermined time elapses. Therefore, the first transistor P431 is not turned off immediately from a turned-on state. In contrast, the first transistor P431 is turned off after the predetermined time elapses. That is, after the second transistor P432 is turned on and the third transistor N433 is turned off, the first transistor P431 is turned on for a predetermined time and then turned off.

Accordingly, since the second control signal CON_2 is in the first logic state for the predetermined time to turn on the transistor N450, the ODT circuit 400 performs the ODT operation. When the predetermined time elapses, the second control signal CON_2 transits to the second logic state, however, the ODT circuit 400 continues to perform the ODT operation by the first control signal CON_1 having the first logic state, which passes through the resistor R.

That is, the second driver 430 causes the ODT circuit 400 to be quickly turned on or off. Since the first control signal CON_1 which is an output signal of the first driver 410 passes through the resistor R, an amount of current available to charge or discharge the gate of the transistor N450 is limited. As a result, the transistor N450 cannot be quickly turned on or off. Accordingly, in order to more quickly turn on or off the ODT circuit 400, the second driver 430 is configured to output the second control signal CON_2 for controlling the turning on/off operation of the transistor N450 for the predetermined time. As the second control signal CON_2 is not current limited by a resistor such as the resistor R, the transistor N450 can be turned on or off faster than using the first driver 410 alone. However, a predetermined period of time after the ODT operation is enabled, the second driver 430 is disabled. That is, transistor P431 turns off. As a result, during the predetermined period of time, the second driver 430 can quickly enable the ODT operation. After the predetermined period of time, the second driver 430 can be disabled so that a majority of the current that is supplied to the gate of the transistor N450 passes through the resistor R, causing the transistor N450 to function as an inductor as described above.

As described above, the second driver 430 can be disabled a predetermined time after the ODT operation is enabled. In an embodiment, the second driver 430 need not be disabled after the ODT operation is disabled. For example, transistor N433 can remain turned on to pull the gate of transistor N450. However, in another embodiment, the second driver 430 can be disabled a predetermined period of time after the ODT operation is disabled as well.

The concept in which the transistor N450 functions as an inductor has been described above in relation to FIG. 3. Since the transistors N350 and N450 illustrated in FIGS. 3 and 4 function as inductors, a parasitic capacitance component Cpa can be compensated for.

Figure 5:
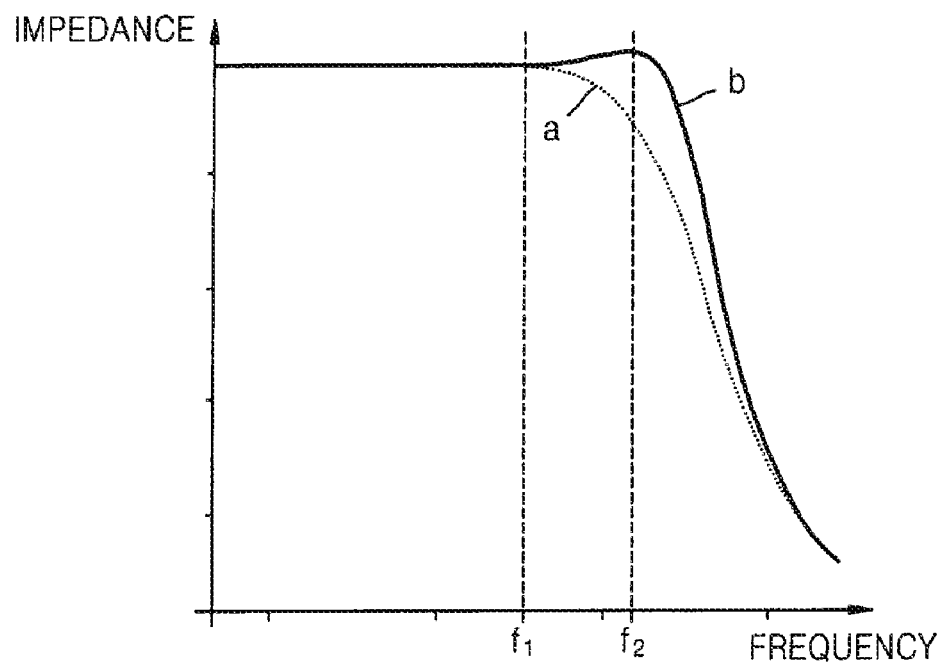
FIG. 5 is a graph showing the change in impedance with respect to the frequency, according to an embodiment and a conventional technique.

FIG. 5 is a graph showing the change in impedance with respect to the frequency, according to an embodiment (b) and a conventional technique (a). Referring to FIGS. 3, 4, and 5, according to the conventional technique (a), impedance is reduced gradually beginning from a frequency f1. The impedance means the total impedance of the ODT circuit 400. However, according to an embodiment (b), since impedance is reduced gradually beginning from a frequency f2, an embodiment can maintain impedance more constantly in the interval from the frequency f1 to the frequency f2, compared to the conventional technique (a). That is, since the transistors N350 and N450 of the ODT circuits 300 and 400 function as inductors, impedance can be maintained more constant at higher frequencies compared to the conventional technique. Furthermore, the effect of junction capacitance or parasitic capacitance in the ODT circuit can be reduced. Therefore, according to an embodiment, it is possible to improve the linearity of impedance and reduce signal reflection, compared to the conventional technique.

Figure 6:
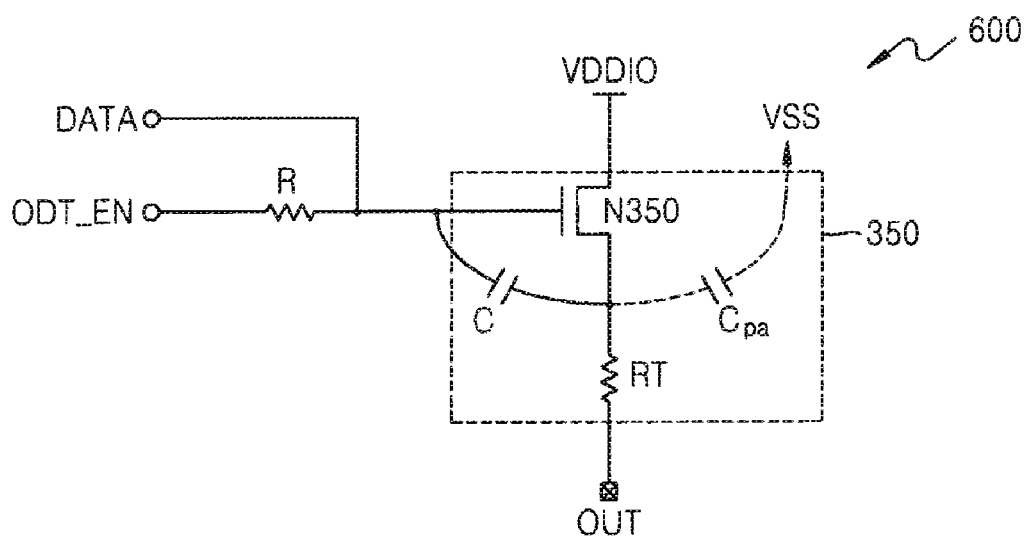
FIG. 6 is a circuit diagram illustrating an embodiment in which the ODT circuit illustrated in FIG. 3 is used as an output terminal.

FIG. 6 is a circuit diagram illustrating a case in which the ODT circuit 300 illustrated in FIG. 3 is used as an output terminal 600. The ODT circuit 600 is configured to perform an ODT operation in response to an ODT enable signal ODT_EN, like the ODT circuit 300 illustrated in FIG. 3. However, in the case of FIG. 6, the ODT circuit 600 can be used as an output driver. Data DATA is applied to the gate of a transistor N350 of a switch unit 350. The ODT circuit 600 outputs the data DATA through an output terminal OUT. Since the ODT circuit 600 is configured to perform an ODT operation similar to the ODT circuit 300 illustrated FIG. 3 when the ODT circuit 600 outputs the data DATA while operating as the output driver, the ODT circuit 600 can output the data DATA while efficiently performing the ODT operation.

Figure 7:
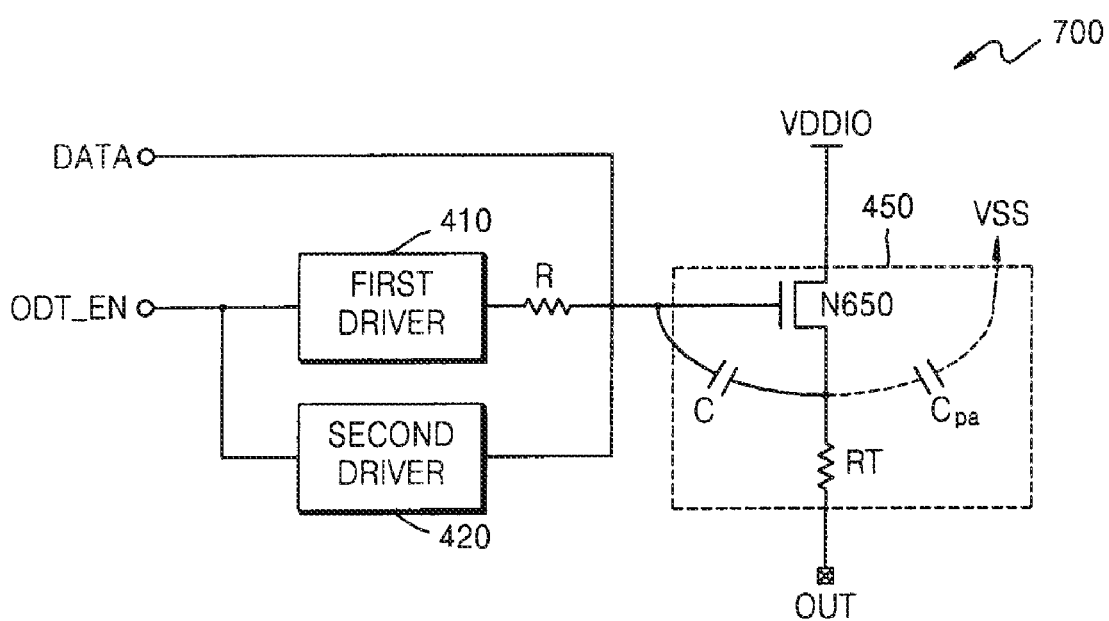
FIG. 7 is a circuit diagram illustrating an embodiment in which the ODT circuit illustrated in FIG. 4 is used as an output terminal.

FIG. 7 is a circuit diagram illustrating a case in which the ODT circuit 400 illustrated in FIG. 4 is used as an output terminal 700. The ODT circuit 700 is configured to perform an ODT operation in response to an ODT enable signal ODT_EN, like the ODT circuit 400 illustrated in FIG. 4. However, in the case of FIG. 7, since the ODT circuit 700 is used as an output driver, data DATA is applied to the gate of a transistor N450 of a switch unit 450, and the ODT circuit 700 outputs the data DATA through an output terminal OUT. Since the ODT circuit 700 is configured to perform an ODT operation as in the ODT circuit 400 illustrated in FIG. 4 when the ODT circuit 700 outputs the data DATA while operating as the output driver, the ODT circuit 700 can output the data DATA while efficiently performing the ODT operation.

As described above, in an ODT circuit according to an embodiment, since a transistor functions as an inductor, it is possible to compensate for a parasitic capacitance component, to maintain constant impedance at higher frequencies, and to thus improve the linearity of impedance. Also, by using an additional driver, the ODT circuit can be more quickly turned on or off. Accordingly, signal reflection is reduced and thus signal integrity is improved, compared to the conventional technique.

An embodiment includes an ODT circuit for performing an ODT operation, which includes a first driver, a second driver, a resistor, and a switch unit. The first driver is configured to output a first control signal indicating whether the ODT operation has to be performed in response to an ODT enable signal. The second driver is configured to output a second control signal indicating whether the ODT operation has to be performed while the ODT enable signal transits. One end of the resistor is coupled to an output terminal of the first driver, and the other end of the resistor is coupled to an output terminal of the second driver. The switch unit is coupled to the other end of the resistor and the output terminal of the second driver, and determines whether the ODT operation has to be performed, in response to the first control signal or the second control signal.

The switch unit can include: a transistor having a gate coupled to the other end of the resistor and the output terminal of the second driver, a first terminal to which a supply voltage is applied, and a second terminal; a termination resistor having one end coupled to the second terminal of the transistor, and the other end coupled to an input/output terminal of the ODT circuit.

The ODT circuit can include a capacitor having one end coupled to the gate of the transistor, and the other end coupled to the second terminal of the transistor and the one end of the termination resistor.

A resistance value of the resistor can be greater than an inverse value of a transimpedance value of the transistor and the first driver may be an inverter.

The second driver may include: at least one inverter configured to invert the ODT enable signal; a first transistor having a gate to which an output signal passing through the at least one inverter is applied, a first terminal to which a supply voltage is applied, and a second terminal; a second transistor having a gate to which the ODT enable signal is applied, a first terminal coupled to the second terminal of the first transistor, and a second terminal; and a third transistor having a gate to which the ODT enable signal is applied, a first terminal coupled to the second terminal of the second transistor, and a second terminal to which a ground voltage is applied.

Another embodiment includes an ODT circuit for performing an ODT operation, the ODT circuit including: a resistor to which an ODT enable signal is applied; and a switch unit coupled to the resistor, and determining whether the ODT operation has to be performed, in response to an ODT enable signal passing through the resistor.

The switch unit can include: an NMOS transistor having a gate coupled to the resistor, a first terminal to which a supply voltage is applied, and a second terminal; and a termination resistor having one end coupled to the second terminal of the transistor, and another end coupled to an input/output terminal of the ODT circuit.

Another embodiment includes an ODT circuit functioning as an output driver for outputting data, and performing an ODT operation, the ODT circuit including: a first driver configured to output a first control signal indicating whether the ODT operation has to be performed, in response to an ODT enable signal; a second driver configured to output a second control signal indicating whether the ODT operation has to be performed, while the ODT enable signal changes; a resistor to transmit the first control signal, and having one end coupled to an output terminal of the first driver, and another end coupled to an output terminal of the second driver; and a switch unit coupled to the other end of the resistor and the output terminal of the second driver, and determining whether the ODT operation has to be performed, in response to the first control signal or the second control signal, wherein the switch unit is configured to output the data while performing the ODT operation.

The switch unit may include: an NMOS transistor having a gate coupled to the other end of the resistor and the output terminal of the second driver and to which the data is applied, a first terminal to which a supply voltage is applied, and a second terminal; and a termination resistor having one end coupled to the second terminal of the transistor, and another end coupled to an input/output terminal of the ODT circuit.

Another embodiment includes an ODT circuit functioning as an output driver for outputting data, and performing an ODT operation, the ODT circuit including: a resistor to which an ODT enable signal is applied; and a switch unit coupled to the resistor, and determining whether the ODT operation has to be performed, in response to an ODT enable signal passing through the resistor.

While embodiments has been particularly shown and described with reference to exemplary embodiments thereof, it will be understood by those of ordinary skill in the art that various changes in form and details may be made therein without departing from the spirit and scope as defined by the following claims.

What is claimed is:

1. An On Die Termination (ODT) circuit for performing an ODT operation, the ODT circuit comprising:
   a first driver configured to output a first control signal at an output terminal of the first driver in response to an ODT enable signal;
   a second driver configured to output a second control signal at an output terminal of the second driver in response to the ODT enable signal;
   a resistor having a first end coupled to the output terminal of the first driver, and a second end coupled to the output terminal of the second driver; and
   a switch unit coupled to the second end of the resistor and the output terminal of the second driver and responsive to the first control signal and the second control signal,
   wherein the output terminal of the first driver is connected through the resistor to the output terminal of the second driver.

2. The ODT circuit of claim 1, wherein the switch unit comprises a transistor having a gate coupled to the second end of the resistor and the output terminal of the second driver, a first terminal coupled to a power supply, and a second terminal.

3. The ODT circuit of claim 2, further comprising a termination resistor having a first end coupled to the second terminal of the transistor, and a second end coupled to an input/output terminal of the ODT circuit.

4. The ODT circuit of claim 2, wherein the first driver is connected in series with the resistor and the first driver and the resistor are connected in parallel with the second driver.

5. The ODT circuit of claim 2, further comprising a capacitor having a first end coupled to the gate of the transistor, and a second end coupled to the second terminal of the transistor.

6. The ODT circuit of claim 2, wherein a resistance value of the resistor is greater than an inverse value of a transimpedance value of the transistor.

7. The ODT circuit of claim 1, wherein the first end of the resistor is directly connected to the output terminal of the first driver, and the second end of the resistor is directly connected to the output terminal of the second driver.

8. The ODT circuit of claim 1, wherein the second driver comprises:
   at least one inverter configured to invert the ODT enable signal;
   a first transistor having a gate to which an output signal passing through the at least one inverter is applied, a first terminal coupled to a power supply, and a second terminal;
   a second transistor having a gate to which the ODT enable signal is applied, a first terminal coupled to the second terminal of the first transistor, and a second terminal; and
   a third transistor having a gate to which the ODT enable signal is applied, a first terminal coupled to the second terminal of the second transistor, and a second terminal coupled to a ground.

9. The ODT circuit of claim 1, wherein the first control signal comprises one of an enable state and a disable state and the second control signal comprises one of an enable state and a disable state, and wherein the switch unit comprises a transistor configured to be in a connected state when either one of the first control signal and the second control signal is in the enable state.

10. The ODT circuit of claim 1, wherein the second driver is configured to change the second control signal for a predetermined time after the ODT enable signal changes.

11. The ODT circuit of claim 1, wherein:
   the ODT circuit is further configured to function as an output driver for outputting data; and
   the switch unit is configured to output the data while performing the ODT operation.

12. The ODT circuit of claim 1, wherein the resistor has a value such that an apparent inductance due to the switching unit resonates with a parasitic capacitance to increase a frequency range over which an impedance of the ODT circuit is substantially linear.

13. The ODT circuit of claim 1, wherein the switch unit is configured to operate at least in part as an inductor in parallel with a parasitic capacitance.

14. The ODT circuit of claim 1, wherein the second driver is configured to substantially disable an operation of the switch unit as an inductor during a predetermined time period after the ODT operation is enabled.

15. An On Die Termination (ODT) circuit for performing an ODT operation, the ODT circuit comprising:
   a resistor having a first end configured to receive an ODT enable signal; and
   a switch unit coupled to a second end of the resistor, the switch unit comprising a transistor having a gate coupled to the resistor, a first terminal coupled to a power supply, and a second terminal;
   wherein the ODT operation is performed in response to the ODT enable signal passing through the resistor, and
   wherein the first end of the resistor is coupled to a first driver configured to receive the ODT enable signal and the second end of the resistor is coupled to a second driver configured to receive the ODT enable signal.

16. The ODT circuit of claim 15, further comprising a termination resistor having a first end coupled to the second terminal of the transistor, and a second end coupled to an input/output terminal of the ODT circuit.

17. The ODT circuit of claim 15, further comprising a capacitor having a first end coupled to the gate of the transistor, and a second end coupled to the second terminal of the transistor.

18. The ODT circuit of claim 15, wherein a resistance value of the resistor is greater than an inverse value of a transimpedance value of the transistor.

19. The ODT circuit of claim 15, wherein:
the ODT circuit is further configured to function as an output driver for outputting data; and
the switch unit is configured to output the data while performing the ODT operation.

20. An On Die Termination (ODT) circuit for performing an ODT operation, the ODT circuit comprising:
an input/output terminal coupled to a first node;
a termination resistor coupled between the first node and a second node;
a transistor coupled between the second node and a power supply, wherein the gate of the transistor is coupled to a third node; and
a resistor coupled between the third node and a fourth node;
wherein the fourth node is coupled to a first driver configured to receive an ODT enable signal and the third node is coupled to a second driver configured to receive the ODT enable signal.

21. The ODT circuit of claim 20, further comprising a capacitor coupled between the second node and the third node.

22. The ODT circuit of claim 20, wherein the resistor has a value greater than an inverse value of a transimpedance value of the transistor.

* * * * *